United States Patent
Hishinuma et al.

(10) Patent No.: US 11,395,102 B2
(45) Date of Patent: Jul. 19, 2022

(54) FIELD COOPERATION SYSTEM AND MANAGEMENT DEVICE

(71) Applicants: KABUSHIKI KAISHA TOSHIBA, Minato-ku (JP); TOSHIBA ENERGY SYSTEMS & SOLUTIONS CORPORATION, Kawasaki (JP)

(72) Inventors: Tomomi Hishinuma, Toshima (JP); Kenji Osaki, Yokohama (JP); Shota Saito, Toshima (JP); Masaaki Ueno, Yokohama (JP)

(73) Assignees: KABUSHIKI KAISHA TOSHIBA, Minato-ku (JP); TOSHIBA ENERGY SYSTEMS & SOLUTIONS CORPORATION, Kawasaki (JP)

( * ) Notice: Subject to any disclaimer, the term of this patent is extended or adjusted under 35 U.S.C. 154(b) by 0 days.

(21) Appl. No.: 16/932,894

(22) Filed: Jul. 20, 2020

(65) Prior Publication Data
US 2021/0029497 A1 Jan. 28, 2021

(30) Foreign Application Priority Data
Jul. 23, 2019 (JP) .............................. JP2019-135249

(51) Int. Cl.
*H04W 4/029* (2018.01)
*G06F 30/13* (2020.01)
*G06T 7/70* (2017.01)

(52) U.S. Cl.
CPC ............ *H04W 4/029* (2018.02); *G06F 30/13* (2020.01); *G06T 7/70* (2017.01); *G06T 2207/30204* (2013.01)

(58) Field of Classification Search
CPC .......... H04W 4/029; G06F 30/13; G06T 7/70; G06T 2207/30204
USPC ....................................................... 455/456.1
See application file for complete search history.

(56) References Cited

U.S. PATENT DOCUMENTS

| 6,244,015 B1 | 6/2001 | Ito et al. | |
| 2016/0012635 A1* | 1/2016 | Kishikawa | G09B 29/005 345/426 |
| 2017/0011210 A1* | 1/2017 | Cheong | H04W 4/00 |
| 2018/0259652 A1* | 9/2018 | Shimizu | G01S 19/49 |

(Continued)

FOREIGN PATENT DOCUMENTS

| JP | 2005-301842 A | 10/2005 |
| JP | 2006-040194 A | 2/2006 |

(Continued)

*Primary Examiner* — Congvan Tran
(74) *Attorney, Agent, or Firm* — Oblon, McClelland, Maier & Neustadt, L.L.P.

(57) ABSTRACT

A field cooperation system according to an embodiment includes a terminal device and a management device. The terminal device includes: a position measurement unit; and a display unit. The position measurement unit measures a position of the terminal device. A display device displays a display image. The management device includes: a database; and a display control unit. The database stores three-dimensional data representing a layout of a structure. The display control unit generates a display image to illustrate the structure and an icon representing the position of the terminal device on the display unit in correspondence with each other based on the three-dimensional data and the measured position of the terminal device.

11 Claims, 7 Drawing Sheets

(56) References Cited

U.S. PATENT DOCUMENTS

| | | | |
|---|---|---|---|
| 2019/0088022 A1* | 3/2019 | Ochiai | G06T 19/006 |
| 2019/0129675 A1 | 5/2019 | Ochiai | |
| 2019/0236844 A1* | 8/2019 | Balasian | G06Q 10/20 |
| 2020/0116493 A1* | 4/2020 | Colburn | G06K 9/00476 |
| 2020/0151450 A1 | 5/2020 | Hishinuma et al. | |
| 2020/0312029 A1* | 10/2020 | Heinen | G06T 7/579 |

FOREIGN PATENT DOCUMENTS

| | | |
|---|---|---|
| JP | 2006-164198 A | 6/2006 |
| JP | 2010-061262 A | 3/2010 |
| JP | 5999679 B2 | 9/2016 |
| JP | 2020-080147 A | 5/2020 |

\* cited by examiner

FIG.4

| Order | Position (Coordinates) | Orientation (Angle) | Member ID | Member Name | Content | Color, Brightness | Reference Information | Result | Time and Date | Person in Charge |
|---|---|---|---|---|---|---|---|---|---|---|
| 1 | (PX,PY,PZ) | (RX,RY,RZ) | P001 | PUMP A | Check of Stop | (R, G, B, A) | http://...co.jp/ip/ | | | |
| 2 | (PX,PY,PZ) | (RX,RY,RZ) | F001 | VALVE A | Check of Closing | (R, G, B, A) | http://...co.jp/ip/ | | | |
| 3 | (PX,PY,PZ) | (RX,RY,RZ) | F002 | VALVE B | Check of Closing | (R, G, B, A) | http://...co.jp/ip/ | | | |
| 4 | (PX,PY,PZ) | (RX,RY,RZ) | F003 | VALVE C | Check of Closing | (R, G, B, A) | http://...co.jp/ip/ | | | |
| 5 | (PX,PY,PZ) | (RX,RY,RZ) | F004 | VALVE E | Check of Closing | (R, G, B, A) | http://...co.jp/ip/ | | | |
| 6 | (PX,PY,PZ) | (RX,RY,RZ) | F005 | VALVE F | Check of Closing | (R, G, B, A) | | | | |

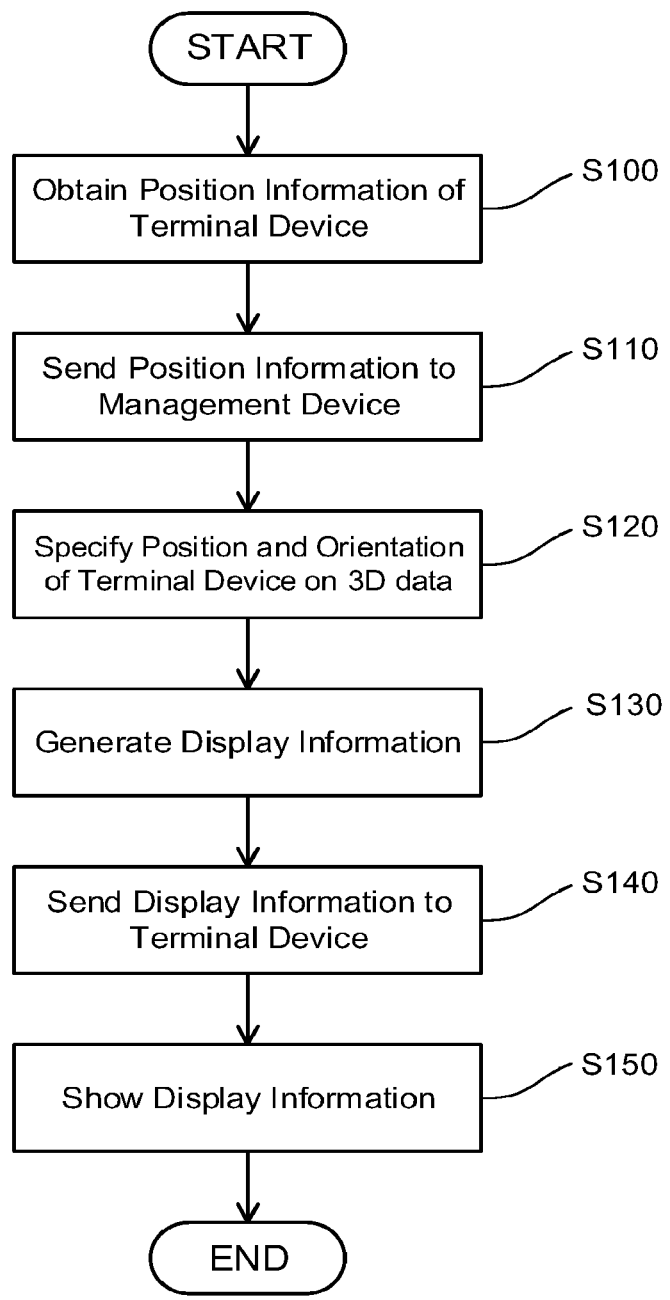

FIELD COOPERATION SYSTEM AND MANAGEMENT DEVICE

CROSS REFERENCE TO RELATED APPLICATION

This application is based upon and claims the benefit of priority from Japanese Patent Application No. 2019-135249, filed on Jul. 23, 2019; the entire contents of which are incorporated herein by reference.

FIELD

The embodiment described hereinafter relates to a field cooperation system and a management device.

BACKGROUND

It is customary to conduct periodic patrol inspections of plants, buildings, facilities, and so on, and, as a result of the inspections, to take some measures if necessary. Efficient work and reliable recording and management of the contents of such patrol inspections and measures are required. In the meantime, for the management of configurations of plants, and so on (configuration•management), development of a system intended for linking 3D-CAD and drawings and specifications together to manage them has been underway. It is conceived that more detailed management of the configuration can be achieved by linking the records of patrol inspections and the contents of measures and field information such as field footage together and managing them.

BRIEF DESCRIPTION OF THE DRAWINGS

FIG. 4 is a schematic view illustrating one example of a work plan table.

FIG. 8 is a view illustrating one example of a screen for imaging assistance (a positioning screen) and FIG. 9 is a flowchart illustrating one example of an operation of the field cooperation system.

DETAILED DESCRIPTION

The data at the field, such as inspection records, are currently not managed in conjunction with the databases mentioned above. Further, current field work includes handwriting recording and recording on a tablet, but differences in inspection places, input errors in recording, and transcription errors in inputting handwritten records may occur. Furthermore, handling is often difficult without experienced workers. As above, traditional methods have difficulty in conducting reliable management with linking the inspection records and design information together.

The embodiment described hereinafter has been made in consideration of such circumstances, and an object thereof is to provide a field cooperation system and a management device that are capable of improving the efficiency of inspection work.

The field cooperation system according to an embodiment includes a terminal device and a management device. The terminal device includes a position measurement unit and a display unit. The position measurement unit measures a position of the terminal device. A display device displays camera images of the terminal device and information necessary for inspections. The management device includes a database and a display control unit. The database stores three-dimensional data representing a layout of a structure. The display control unit generates a display image to illustrate the structure and an icon representing the position of the terminal device on the display unit in correspondence with each other based on the three-dimensional data and the measured position of the terminal device.

According to the embodiment, there are provided the field cooperation system and the management device that are capable of improving the efficiency of inspection work.

Figure 1:
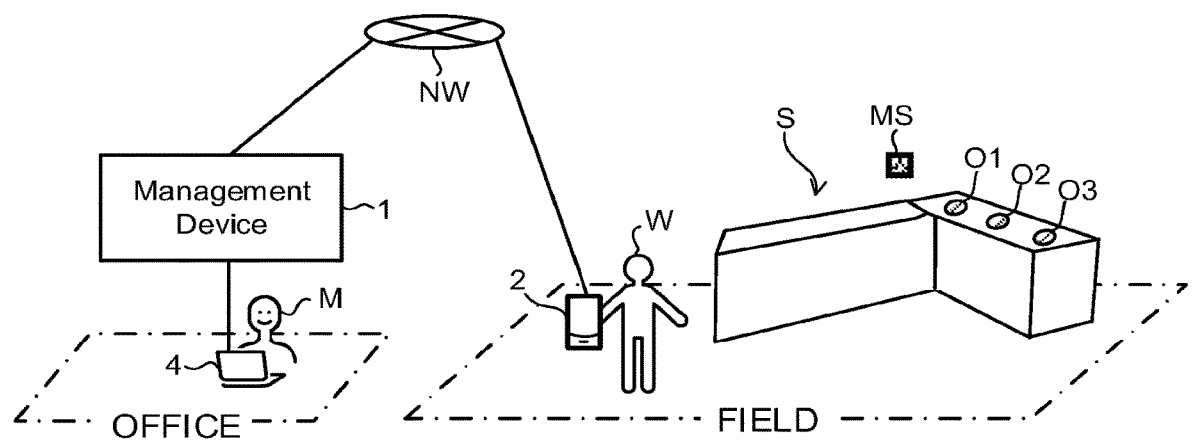
FIG. 1 is a view expressing an outline of a field cooperation system.

Hereinafter, there will be explained an embodiment of a field cooperation system in detail with reference to the drawings. As illustrated in FIG. 1, the field cooperation system in this embodiment includes a management device 1 and a terminal device 2 that are connected via a network NW. A manager M in an office handles the management device 1 and a worker W at a field carries and operates the terminal device 2.

The network NW is, for example, a LAN (Local Area Network), a WAN (Wide Area Network), the Internet, or a potable communication network. The network NW may be formed by a predetermined network system, for example, a wireless LAN access point or an antenna. For example, the WiFi standard can be used for the wireless LAN.

The field cooperation system establishes cooperation between (work of) the worker W at the field and the manager M in the office. At the field, a structure S and a target member O (O1, O2, and O3, here) to be a target subjected to work such as check or inspection are placed.

The field (area) where the worker W works is in a building provided in a predetermined section in a power plant, for example, which includes a plurality of rooms surrounded by walls. In each of the rooms, the target member O to be worked is placed. These target members O may be an instrument, an operation switch, a valve, a pipe, a device, or a sensor.

The target member O may be a predetermined part of a building, for example, may be in a range of a part of a window, a door, a wall, a ceiling, a floor, a passageway, a wall opening, or an interior space. Further, a part of a single huge apparatus may be the target member. Further, a plurality of portions of a single apparatus may be the target member O.

At the field, one or more reference markers MS, which serve as a positional reference, are placed. Further, as will be described later, a target marker MO may be placed in correspondence with the target member O. These details will be described later.

The management device 1 is connected to a display 4 on which the manager M performs visual recognition. Incidentally, the management device 1 can be made of, for example, a personal computer (for example, a desktop personal computer, a notebook personal computer, or a tablet personal computer).

The terminal device 2 can be made of a smartphone or a personal computer (for example, a wearable computer (smartglasses), a tablet personal computer, or a note personal computer). The wearable computer is equipped with a transmission-type head-mounted display to be worn by the worker W. Besides, the terminal device 2 may be composed of a plurality of devices having a photographing (imaging) function, a phoning function, and a communication function respectively.

Figure 2:
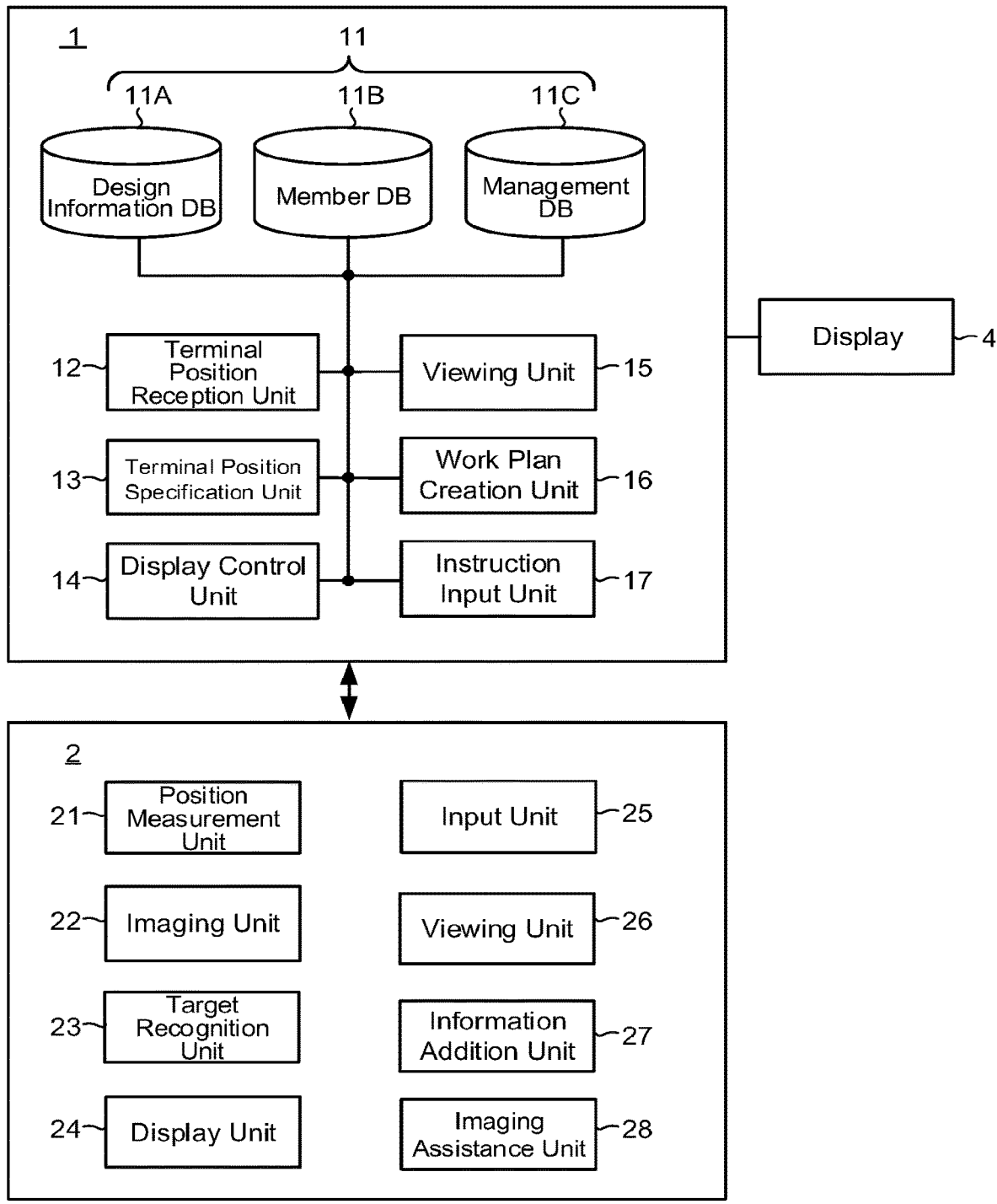
FIG. 2 is a block diagram illustrating the field cooperation system.

FIG. 2 is a block diagram of the field cooperation system. The management device 1 includes a database 11 (a design information database 11A, a member database 11B, and a management database 11C), a terminal position reception unit 12, a terminal position specification unit 13, a display control unit 14, a viewing unit 15, a work plan creation unit 16, and an instruction input unit 17. The terminal device 2 includes a position measurement unit 21, an imaging unit 22, a target recognition unit 23, a display unit 24, an input unit 25, a viewing unit 26, an information addition unit 27, and an imaging assistance unit 28.

The database 11 is a storage device that holds data and can be divided into the design information database 11A, the member database 11B, and the management database 11C according to content. The design information database 11A stores three-dimensional data regarding layouts and dimensions of plants, structures (buildings, facilities), and so on (for example, three-dimensional CAD data) and information on drawings (pipe connection diagrams, layout drawings of members (devices, and so on), outline drawings, and structural drawings).

The member database 11B stores books, drawings, or data of design materials, specifications, and so on regarding members (devices, and so on) of a structure. The member database 11B can store additional information. The additional information includes information on patrol inspections, photographs•videos photographed at the field (for example, images photographed by the imaging unit 22), laser scan data acquired after construction or remodeling, and so on. The additional information can be added by the information addition unit 27 in the terminal device 2 as will be described later.

The management database 11C stores attribute information such as the name of a member, its position, and specifications. In the management database 11C, a reference position management table is provided. In the reference position management table, 3D position information, a marker ID, and a member ID are registered in correspondence with a reference position ID. The reference position ID is identification information capable of identifying a plurality of reference positions (reference markers MS) individually. Incidentally, a single reference position ID is assigned to a single reference position.

The 3D position information registered in the reference position management table is information on three-dimensional coordinates specifying the position where the reference marker MS is provided. Incidentally, the coordinate information includes information specifying the positions in the horizontal direction (X and Y axes) and the vertical direction (Z axis). Further, this 3D position information includes information regarding the orientation or direction of the reference position. Coordinates can be set with the aforementioned reference marker MS set as the origin (starting point). Incidentally, as for the coordinates, it is not necessary to set the reference marker MS as the origin, and a predetermined position of a building may be set as the origin of the coordinates.

The marker ID is identification information capable of identifying a plurality of reference markers MS individually. A single marker ID is assigned to a single reference marker MS. The member ID is identification information capable of identifying a plurality of target members O individually. A single member ID is assigned to a single target member O.

In the management database 11C, a member management table is provided. In the member management table, 3D position information, a member name, reference information (reference information itself or its location), a marker ID, an appearance image ID, and a 3D shape ID are registered in correspondence with a member ID.

The 3D position information is position information indicating the coordinates specifying the position of the target member O. Incidentally, the 3D position information includes information specifying the positions in the horizontal direction (X and Y axes) and the vertical direction (Z axis). Further, this 3D position information includes information regarding the orientation or direction of the target member O. The member name is the name of a target member. The reference information is information (for example, drawings, books) itself or its location (for example, a link to a destination where the reference information is stored) relating to the target member O.

The marker ID is identification information capable of individually identifying the target marker MO corresponding to the target member O. As will be described later, the use of the target marker MO facilitates the recognition of the target member O by the target recognition unit 23 in the terminal device 2.

A single marker ID is assigned to a single target marker MO. However, a single marker ID may be assigned to a plurality of target members O. The marker ID does not need to be assigned to the target member O. That is, the target marker MO does not need to be placed on the target member O or at a position close thereto. In this case, the target member O is recognized based on an appearance image or three-dimensional shape information.

The appearance image ID is identification information capable of individually identifying appearance images of a plurality of target members O registered in the management database 11C beforehand. Incidentally, a plurality of appearance image IDs may be registered in correspondence with a single member ID. That is, a plurality of appearance images obtained by photographing a single target member O from different directions may be registered in the management database 11C beforehand.

Incidentally, the appearance image ID does not need to be assigned to the target member O. That is, the appearance image of the target member O does not need to be registered in the management database 11C. In this case, the target member O is recognized based on the target marker or the three-dimensional shape information. The management database 11C stores a work plan and resulting information (a later-described work plan table). This detail will be described later.

The terminal position reception unit 12 receives position information of the terminal device 2 (information on measured position and orientation of the terminal device 2) transmitted from the terminal device 2. The terminal position specification unit 13 specifies the position and orientation of the terminal device 2 on the three-dimensional data in the design information database 11A (converts the coordinates of the position and orientation of the terminal device 2 to coordinates on the three-dimensional data).

The display control unit 14 generates an image illustrating the structure S (an image corresponding to the position and orientation of the terminal device 2) based on the three-dimensional data and the measured position and orientation of the terminal device 2. The display control unit 14 adds icons representing the position and orientation of the terminal device 2 (a terminal position icon Ip and a terminal direction icon Ir that will be described later) to this image and transmits the resultant image to the terminal device 2. This image is displayed on the display unit 24 in the terminal device 2. That is, the display control unit 14 has a function of displaying the image illustrating the structure S and the icon representing the position of the terminal device 2 on the display unit 24 in the terminal device 2 in correspondence with each other based on the three-dimensional data and the measured position of the terminal device 2.

The processing to receive the position information, the processing to specify the position, and the processing to generate an image by the terminal position reception unit 12, the terminal position specification unit 13, and the display control unit 14 can be performed in real time. That is, the display control unit 14 updates the position (and orientation) of the icons (the terminal position icon Ip, the terminal direction icon Ir) to be displayed on the display unit 24 in the terminal device 2 in response to the terminal position reception unit 12 receiving the information on the position (and orientation).

The display control unit 14 can display various images on the display unit 24 in the terminal device 2 as follows. For example, the display control unit 14 can display a second icon that identifies the order of work on the target member O (a later-described target member icon Io) on the display unit 24 in the terminal device 2 so as to correspond to the position of the target member O.

The display control unit 14 can display a third icon (a later-described reference information icon Irf) corresponding to reference information (the reference information itself or its location) of the target member O on the display unit 24 in the terminal device 2. As will be described later, the viewing unit 26 in the terminal device 2 operates the reference information icon Irf, thereby making it possible to view the reference information.

The display control unit 14 can display a work instruction input by the later-described instruction input unit 17 on the display unit 24 in the terminal device 2 so as to make it correspond to the position on the three-dimensional data. The display control unit 14 can display additional information input by the information addition unit 27 in the terminal device 2 on the display unit 24 in the terminal device 2, as described later.

The viewing unit 15 can view information necessary for the manager M. When the manager M inputs, for example, a search word, relevant information (for example, a relevant part of a CAD drawing or book) is extracted from the database 11 to be displayed on the display 4. The viewing unit 15 is a user interface (UI) of a personal computer or tablet personal computer, for example.

Figure 3:
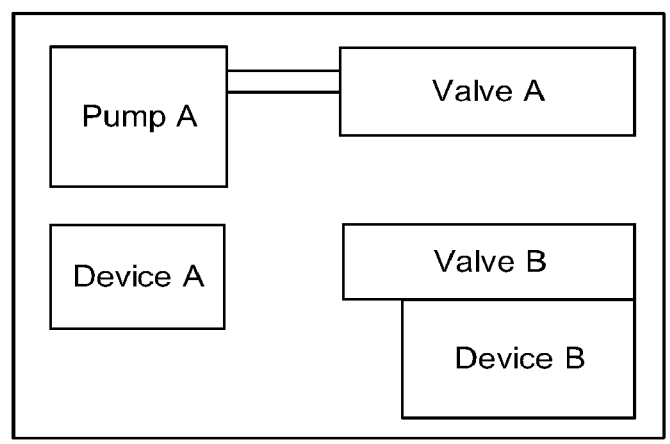
FIG. 3 is a schematic view illustrating one example of a method of selecting a target member.

The work plan creation unit 16 helps the manager M make a work plan. Therefore, the work plan creation unit 16 has a member selection function and an input function. The work plan creation unit 16 provides the member selection function that facilitates the selection of a target member by the manager M. For example, the work plan creation unit 16 displays a layout for target member selection and a list. FIG. 3 is one example of the layout for target member selection, where figures representing a plurality of members (in this case, a pump A, valves A and B, and devices A and B) are displayed. The manager M can select the target member on this screen. For example, the manager M clicks (or taps) on the image of the member to be worked.

The work plan creation unit 16 provides the input function that facilitates the input of a work plan by the manager M. For example, the work plan creation unit 16 displays a table for a work plan (the work plan table). FIG. 4 is one example of the input work plan table where members, the order of work, and so on are illustrated in correspondence with one another. For details, the work plan table illustrates order (No.), a position (coordinates: PX, PY, PZ), an orientation (angle: RX, RY, RZ), a member ID, a member name, an inspection content, and color•brightness (R, G, B, A) of corresponding icons, reference information, a result, a time and date, and a person in charge in correspondence with one another. Incidentally, the items of result, time and date, and person in charge are left blank here because the worker W inputs each information there at the time of inspection.

The order (No.) indicates the order of inspection. Here, the inspection work is performed in the order of integers 1 to 6. The coordinates (PX, PY, PZ) and the angle (RX, RY, RZ) are the position (coordinates) of a place where a target member is placed and the orientation (angle) of the target member. The member ID is an identifier that identifies a member. The member name is the name of a target member. The content is the content of inspection. For example, it is a check whether a valve is open or closed and a check whether a pump is operating or stopped. The color•brightness is the color and brightness of icons representing the target member O. Here, the colors are represented by the three primary colors of R, G, and B. The reference information is the information related to the member, for example, drawings and books. The link to a destination where the reference information is stored (a location of the reference information, for example, URL) is described, here. However, it may be the reference information itself.

The manager M does not need to input all the pieces of information to the work plan table. When a target member corresponding to the order of work is selected, the work plan creation unit 16 can automatically input the coordinates, the angle, the member ID, the member name, and (the location of) the reference information. At this time, the 3D position information, the member ID, the member name, and the information on (the location of) the reference information in the member management table in the management database 11C can be used. Incidentally, the manager M may appropriately change the content of inspection and the color and brightness of icons, for example.

The instruction input unit 17 is intended for the manager M in the office to present instruction information to the working worker W. The instruction input unit 17 inputs a position on the three-dimensional data and a work instruction. That is, the manager M can specify the position on the three-dimensional data to transmit the work instruction with a virtual sticky note, or the like by using the instruction input unit 17. By clicking or the like on the space of the three-dimensional data displayed by the viewing unit 15 (UI) in the office, the position can be specified.

The management device 1 transmits the position on the three-dimensional data and the work instruction to the terminal device 2. The display unit 24 in the terminal device 2 can display information on the work instruction, along with an image captured by the imaging unit 22 (a real-space image). The information on the work instruction is displayed on the display unit 24 so as to correspond to the input position. As a result, the worker W can check the instruction information on the terminal device 2. Incidentally, information of the virtual sticky note can be in list form. Incidentally, the display control unit 14 may display the input work instruction on the display unit 24 in the terminal device 2 so as to make it correspond to the position on the three-dimensional data.

The position measurement unit 21 measures the position and orientation of the terminal device 2 itself (self). Various methods can be applied to this measurement as follows.

(1) GPS (Global Positioning System)

When the field is outdoors, a satellite positioning system, for example, a GPS may be used. In other words, it is possible to check the position of the terminal device 2 by receiving radio waves from a GPS satellite. When the field is indoors, PDR, a beacon, or simultaneous localization and mapping (SLAM) may be applied as follows.

(2) Pedestrian Dead Reckoning (PDR)

In the PDR, for example, an inertial sensor such as an acceleration sensor or an angular velocity sensor is used to measure the position and orientation of the terminal device 2. When the acceleration sensor is mounted on the terminal device 2, the acceleration generated when the terminal device 2 moves can be detected. Further, this acceleration sensor makes it also possible to detect gravitational acceleration. When the angular velocity sensor (a gyro sensor) is mounted on the terminal device 2, the angular velocity generated when the orientation of a casing of the terminal device 2 changes can be detected. The orientation of the terminal device 2 can be recognized by the orientation of the casing of the terminal device 2.

(3) SLAM

For estimating the position and orientation of the terminal device 2, the SLAM (Simultaneous Localization and Mapping) technology, the SfM (Structure from Motion) technology, or the like can be used. For example, by using the VSLAM (Visual SLAM) technology, the displacement of the position and the displacement of the orientation of the terminal device 2 can be calculated based on the image photographed by the terminal device 2.

In the VSLAM technology, it is possible that, for example, a stereo camera is used for the imaging unit 22 in the terminal device 2, and feature points of an object in the vicinity of the terminal device 2 are extracted using information acquired by a three-dimensional measurement sensor. The collection of these feature points is referred to as three-dimensional feature point cloud data. Then, a photographed image (a moving image) photographed by the stereo camera is analyzed to track the feature points of the object (for example, sides or corners of a box-shaped object) in real time. Based on the three-dimensional feature point cloud data, three-dimensional information on the position and orientation of the terminal device 2 can be estimated.

The three-dimensional measurement sensor measures a three-dimensional shape of the object in the vicinity of the terminal device 2. The three-dimensional measurement sensor is provided on the back side of the casing of the terminal device 2, for example, a laser beam is projected onto the object, and a light-receiving element receives reflected light of the laser beam, and thereby, the distance from the terminal device 2 to the object can be measured. For example, the three-dimensional measurement sensor can measure the distance from the terminal device 2 to the object in its vicinity to make the distance into a three-dimensional point cloud by using the ToF (Time of Flight) method, which converts a delay time of a light-receiving pulse to a projection pulse into a distance.

Further, the three-dimensional feature point cloud data of the object in the vicinity of the terminal device 2 are detected at a predetermined time interval, and based on displacements between time-series prior and following three-dimensional feature point cloud data, the displacement of the position and the displacement of the orientation of the terminal device 2 can be calculated. Further, from serial positions and orientations of the terminal device 2 that are obtained in a time series, a movement path of the terminal device 2 between the current position and orientation and the previous position and orientation can be obtained.

As described already, the reference marker MS, which serves as a reference point, is placed at the field and a relative position (X, Y, Z) from the reference marker MS is calculated, thereby making it possible to acquire the position information of the terminal device 2. By using the already-described reference position management table, the position of the terminal device 2 on the three-dimensional data can be checked.

When starting work, the worker W first photographs the reference marker MS. Here, the terminal device 2 estimates the position and orientation of the terminal device 2 based on the photographed image in which the reference marker MS appears. Incidentally, the worker W starts to photograph the reference marker MS and continues to photograph even during moving, thereby making it possible to estimate the movement path of the terminal device 2 that has moved from the reference position.

The target marker MO can be placed on the target member O or at a position close thereto. Incidentally, the position close to the target member O indicates the position within a range that appears simultaneously with the target member O when the terminal device 2 photographs the target member O.

The reference marker MS and the target marker MO are figures that can be recognized by image recognition. For example, a matrix-type two-dimensional code, what is called a QR code (registered trademark), can be used as the reference marker MS and the target marker MO. Further, the reference marker MS and the target marker MO each include information indicating the marker ID that can be distinguished from other reference markers MS and target markers MO. In this way, a plurality of the reference markers MS and a plurality of the target markers MO each can be distinguished from one another. Pieces of information regarding the target member O are registered in the management database 11C (the member management table) in the management device 1 in correspondence with the respective marker IDs.

As a method of providing the reference marker MS and the target marker MO, for example, a panel on which the reference marker MS and the target marker MO are printed is prepared, and this panel is placed on a wall surface or in the vicinity of the target member O at the field before work starts. Incidentally, the reference marker MS and the target marker MO may be printed directly on the wall surface or the target member O.

The imaging unit 22 has, for example, an image element such as a CCD (Charge-Coupled Device), which optically photographs an object in the vicinity of the terminal device 2. The imaging unit 22 may be a stereo camera. The stereo camera has two lens-attached image elements provided on the back side of the casing, and simultaneously photographs the object from a plurality of different directions, and thereby information in the depth direction to the object can be acquired. The stereo camera can be used for the VSLAM processing in the already described position measurement unit 21 and for the recognition of the target member O in the later-described target recognition unit 23.

The target recognition unit 23 recognizes the target member O appearing in the photographed image. The target recognition unit 23 recognizes which object is the target member O among the objects appearing in the photographed image based on the position and orientation (a photographing direction) of the terminal device 2 and the position corresponding to the target member O, for example.

Further, the target recognition unit 23 may recognize the target member O based on the position information corresponding to the target marker MO. In this way, the target member O can be recognized based on the target marker MO, thus enabling the improvement in the recognition accuracy of the target member O.

Further, the target recognition unit 23 recognizes the target member O based on the photographed image in which the target marker MO appears. In this way, the target member O can be recognized by the target marker MO, thus enabling the improvement in the recognition accuracy of the target member O.

Further, the target recognition unit 23 may recognize the target member O based on a photographed appearance image. In this way, the target member O can be recognized based on the appearance of the object, thus enabling the improvement in the recognition accuracy of the target member O.

Further, the target recognition unit 23 may recognize the target member O based on three-dimensional shape information. In this way, the target member O is recognized based on the three-dimensional shape of the object, thus enabling the improvement in the recognition accuracy of the target member O. The three-dimensional shape information may be acquired based on a photographed image photographed by the imaging unit 22 (the stereo camera, here) or based on the three-dimensional measurement sensor.

The display unit 24 is a display device, for example, a liquid crystal display device or an EL (Electro-Luminescence) display device, and displays images transmitted from the display control unit 14 in the management device 1 and photographed images photographed by the imaging unit 22. The input unit 25 is an input device operated by the worker W to enable an input operation of predetermined information. The input unit 25 can be made of a touch panel that is provided integrally with the display unit 24.

Figure 5:
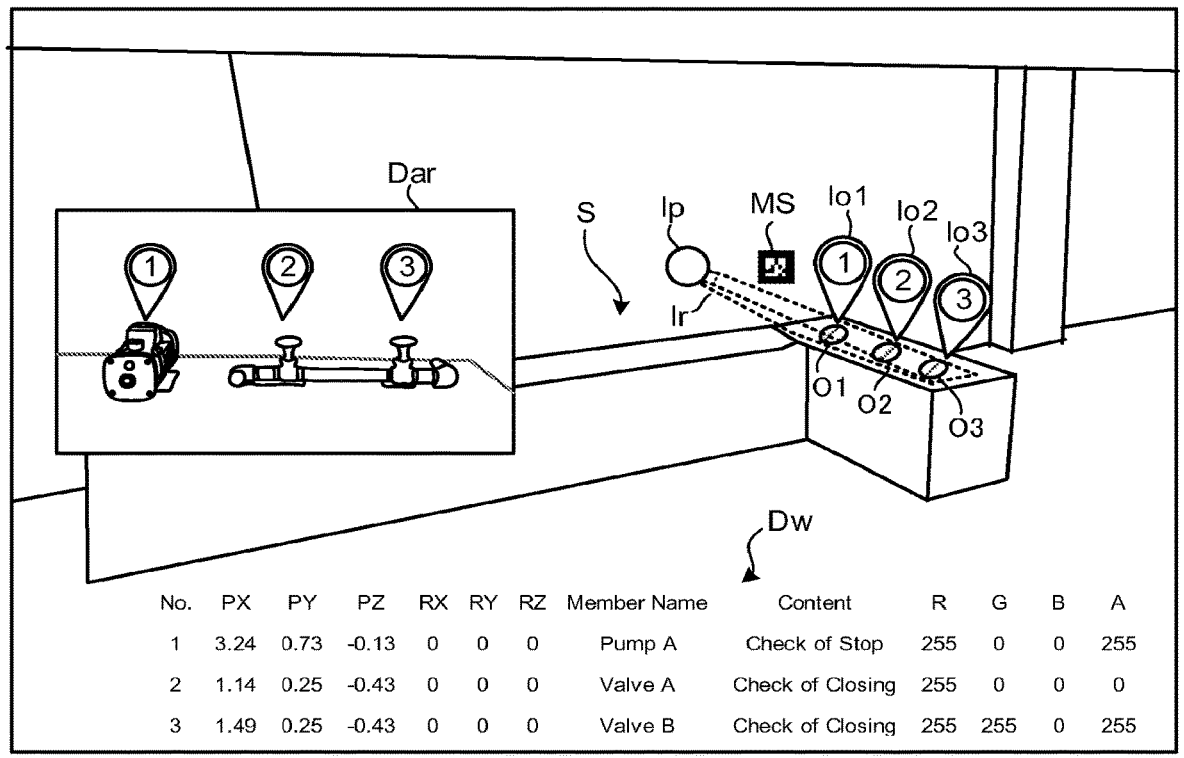
FIG. 5 is a view illustrating one example of an image displayed on a screen of a terminal device 2.

FIG. 5 illustrates an example of an image displayed on the screen of the terminal device 2. On the display unit 24 in the terminal device 2, a stereoscopic image of the structure S including the target member O (O1, O2, and O3 here) is displayed. This image is a virtual space display based on image data from the management device 1 based on the three-dimensional data. The image includes target member icons (a fourth icon corresponding to the member) Io1 to Io3, the terminal position icon Ip, the terminal direction icon Ir, a work content display Dw, and an AR display Dar.

The target member icons Io1 to Io3 correspond to the target members O1, O2, and O3 respectively, and are displayed based on the order of work (No. 1, 2, and 3, here) and the color•brightness (R, G, B, A) of the corresponding icons that are defined in the work plan table. That is, the target member icons Io1 to Io3 represent the order of work on the target member O.

The terminal position icon Ip and the terminal direction icon Ir together correspond to the icons representing the position and orientation of the terminal device. The terminal position icon Ip is displayed in correspondence with the position of the terminal device 2, which facilitates a position check by the worker W. The terminal direction icon Ir represents the orientation of the terminal device 2 (the imaging direction). The range represented by this icon Ir is the imaging range. Here, the terminal device 2 is directed to the target members O1, O2, and O3.

As the work content display Dw, some of the contents of the work plan table are illustrated. Here, the order (No.), the coordinates (PX, PY, PZ), the angles (RX, RY, RZ), the member names, the contents of inspection, and the color•brightness of the corresponding icons (R, G, B, A) are illustrated.

Figure 6:
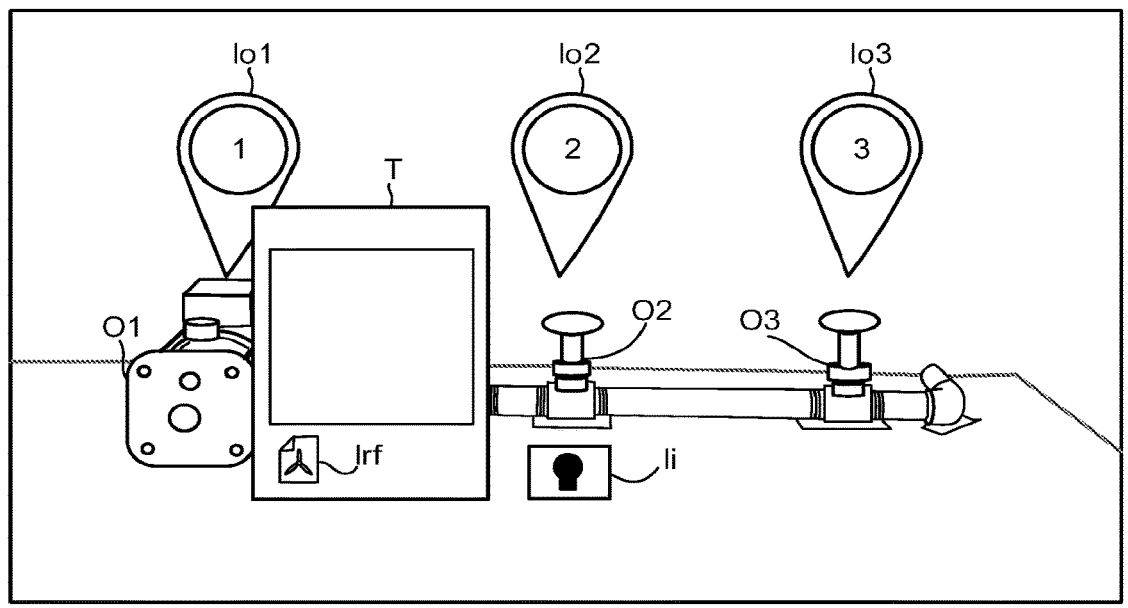
FIG. 6 is a view illustrating a part of FIG. 5.

The AR display Dar is displayed on the stereoscopic image of the structure S and can be moved relatively thereon. FIG. 6 illustrates the AR display Dar in an enlarged manner. The AR display Dar uses an augmented reality (AR) technology and displays an image captured by the imaging unit 22 in the terminal device 2 and the target member icons Io1 to Io3 in a superimposed manner. The target recognition unit 23 recognizes the target member O, thereby enabling the target member icon Io corresponding to the position of the target member O to be displayed. Incidentally, the AR technology is a technology to display a predetermined content such as 3D models or texts in correspondence with the position of a predetermined object, or the like in an image in which a real environment appears (for example, an image photographed by the imaging unit 22).

As illustrated in FIG. 6, for example, when the target member icon Io (Io1 to Io3) is tapped, an explanation screen T of the target member O corresponding to the icon and the reference information icon Irf are displayed. The explanation screen T includes the order (No.), the coordinates (PX, PY, PZ), the angle (RX, RY, RZ), the member ID, the member name, and the information on the content that are illustrated in the work plan table, for example.

The viewing unit 26 views the reference information by operating the displayed third icon. When the worker W uses the viewing unit 26 to tap the reference information icon Irf, drawings and books related to the target member O are displayed. Here, the link to the reference information is opened to display the reference information. However, when the work plan table includes the reference information itself, the reference information only needs to be displayed as it is.

At the current field work, it is necessary to bring in a binder for checking drawings and books and to select the relevant ones on the spot, but this function reduces the burden of such a task. Further, it is also possible to transmit the drawings and books that should be checked from the office depending on the state of the work.

The information addition unit 27 inputs additional information regarding the member. By using the information addition unit 27, the member selection and the additional information input can be made as follows. The worker W uses the information addition unit 27 to select the member to which information is to be added. This selection can be made, for example, by tapping the target on the AR display Dar. This tap causes the target recognition unit 23 to function and the member is specified. As a result, an information addition icon Ii is displayed so as to correspond to the specified member. Tapping the information addition icon Ii enables the input of information regarding the target, and the information can be input by the input unit 25.

The input additional information is transmitted to the management device 1. At this time, the position information for the target is added to be transmitted with the additional information and they are reflected on the management database 11C appropriately. This additional information can be placed on the real space and/or on the three-dimensional data (3D-CAD) space by a virtual sticky note. The color of the sticky note may be changeable in response to its content.

At this time, in addition to text information, image information (for example, a photograph photographed by the imaging unit 22) can also be added, and further, information on the position and orientation of the terminal device 2 at a photographing time may be recorded and stored. In this case, the imaging unit 22 photographs an image as the additional information, and the image is recorded with the position and orientation of the terminal device 2 at a photographing time.

Incidentally, in the foregoing, the case where the information transmission is performed between the management device 1 and the terminal device 2 in real time via the network NW has been explained, but the management device 1 and the terminal device 2 do not always need to be connected via the network NW. A configuration is also applicable in which the management device 1 and the terminal device 2 are connected via the network NW, another network, or by wire such as a USB only when transferring information therebetween.

The imaging assistance unit 28 assists in re-photographing corresponding to the recorded position and orientation (photographing at the same position•orientation). When the timing of the work is another time and date or the person in charge is different, for example, it is possible to reproduce the position and orientation at a photographing time, perform checking through the same view, and record the processing content at the same position and angle.

Figure 7:
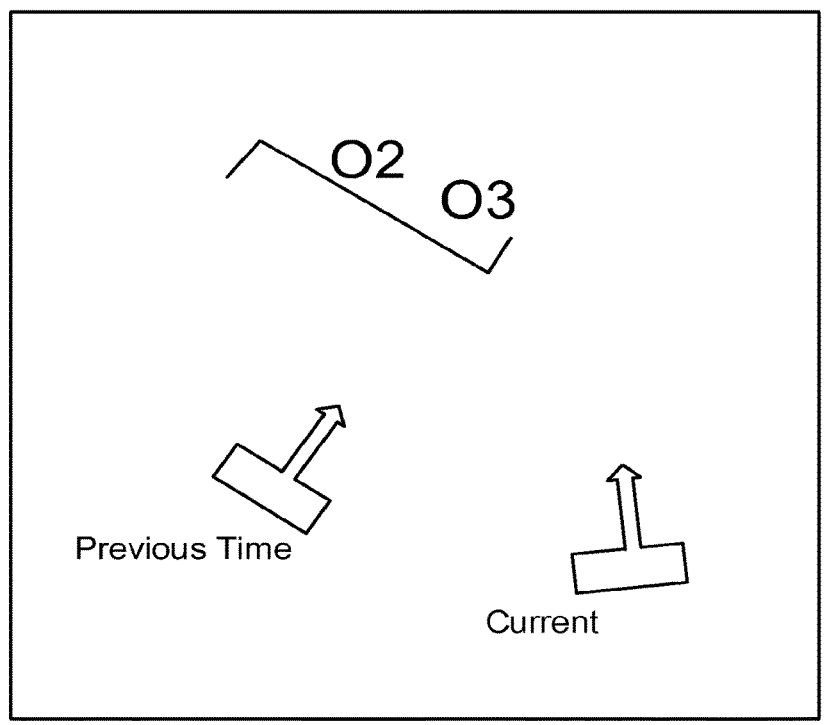
FIG. 7 is a view illustrating one example of a screen for imaging assistance (a layout view).
Figure 8:
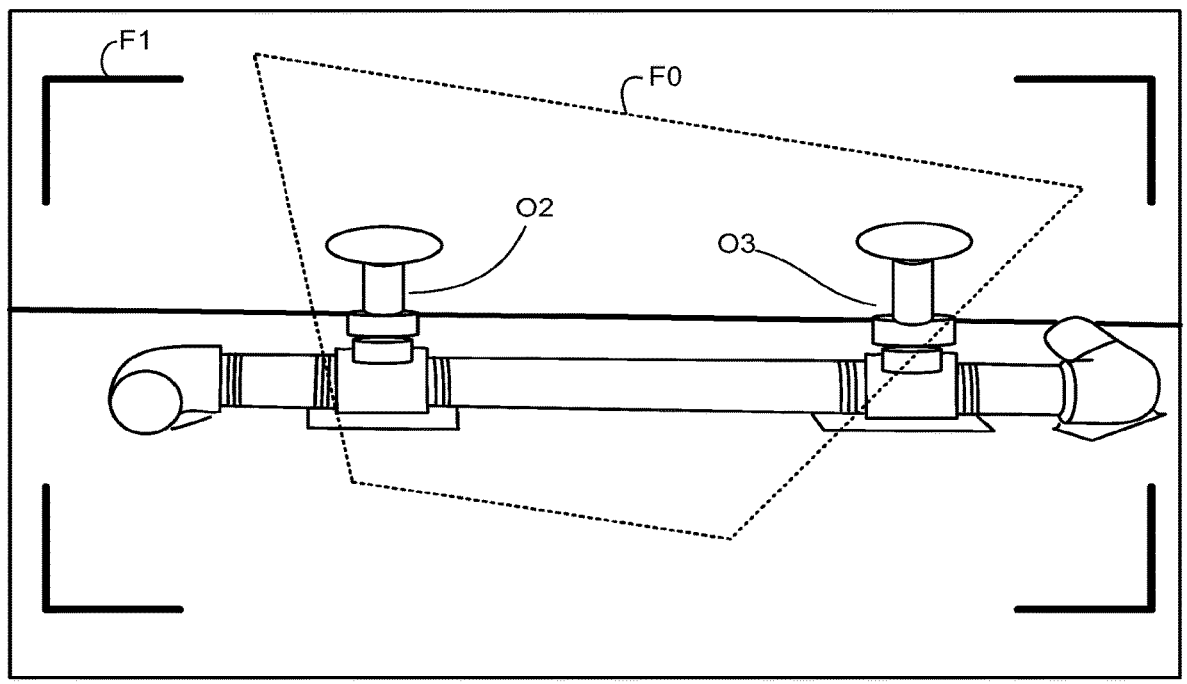

The imaging assistance unit 28 displays an imaging range corresponding to the recorded position and orientation of the terminal device 2 on the display unit 24 as follows. First, as illustrated in FIG. 7, the position and orientation where photographing was performed previously and the current position and orientation are illustrated in a layout view. If there are any other devices in the vicinity, they are displayed. This display makes it possible to check the relationship between the photographing position and the current position and conduct guidance to the photographing position. As illustrated in FIG. 8, a frame F1 and a past frame F0 are displayed on a photographed screen of the terminal device 2. The frame F1 is a frame representing the current imaging range. The frame F0 represents the imaging range corresponding to the position and orientation of the terminal device 2 when the target was photographed in the past.

When the current position and orientation of the terminal device 2 and the past position and orientation of the terminal device 2 match each other, the range (four corners) of the frame F0 and the range (four corners) of the frame F1 match each other. However, when the current position and orientation of the terminal device 2 and the past position and orientation of the terminal device 2 do not match each other, the range (four corners) of the frame F0 and the range (four corners) of the frame F1 do not match each other. When the distance between the current terminal device 2 and the target is farther away than it was in the past, for example, the frame F0 becomes smaller than the frame F1. Further, when the angle between the current terminal device 2 and the target is different from that in the past, the frame F0 and the frame F1 are different in the orientation.

The worker W adjusts the distance and the angle between the terminal device 2 and the target so that the frames F0 and F1 match each other, thereby enabling photographing at the same position and orientation as in the past measurement.

(Operation of the Field Cooperation System)

Hereinafter, there will be explained an operation of the field cooperation system with reference to FIG. 9.

(1) Creation of a Work Plan

A work plan is created. The manager M uses the work plan creation unit 16 to create a work plan table that specifies the target member O, the order, and so on.

(2) Position Check of the Terminal Device 2

The worker W causes the imaging unit 22 to capture an image of the reference marker MS at the field. Based on the captured image, the position and orientation of the terminal device 2 (the reference position-orientation) is determined. The information on the reference position management table in the management device 1 can be used for this determination. However, this determination may be made by either the management device 1 or the terminal device 2. The position measurement unit 21 in the terminal device 2 can accurately measure the position and orientation of the current terminal device 2 by using this reference position•orientation in combination with measurement by, for example, PDR, SLAM, a beacon, or the like (S100). The measured position and orientation of the terminal device 2 is sent to the management device 1 as position information (S110).

(3) Display in the Terminal Device 2

The terminal position reception unit 12 receives the position information of the terminal device 2 and the terminal position specification unit 13 specifies the position and orientation of the terminal device 2 on the three-dimensional data in the design information database 11A (S120). The display control unit 14 generates the image illustrating the structure based on the three-dimensional data and the position and orientation of the terminal device 2 (S130). The display unit 24 in the terminal device 2 enables both a virtual space display and an augmented reality (AR) display as follows.

a) Virtual Space Display

The display unit 24 in the terminal device 2 displays the image illustrating the structure S and the icons representing the position and orientation of the terminal device 2 (the terminal position icon Ip and the terminal direction icon Ir). This display can be the virtual space display that does not include an image of the real space.

For example, the display control unit 14 in the management device 1 can display the image illustrating the structure S and the icons representing the position and orientation of the terminal device 2 on the display unit 24 based on the three-dimensional data and the position and orientation of the terminal device 2 measured by the position measurement unit 21. At this time, the display control unit 14 can update the positions of the icons to be displayed on the display unit 24 every time the terminal position reception unit 12 receives the position information from the terminal device 2. Further, the display control unit 14 displays the second icon that identifies the order of work (the target member icons Io1 to Io3) on the display unit 24 in correspondence with the position of the target member O As above, the icons Ip and Ir representing the position and the orientation of the terminal device 2 and the icon Io representing the target member O are displayed, thereby making it possible to assist the worker W. Further, a part of the work plan (the work content display Dw) is displayed on the screen, thereby achieving the convenience of the worker W.

b) Augmented Reality (AR) Display

The display unit 24 in the terminal device 2 displays the image photographed by the imaging unit 22 and the fourth icon corresponding to the target member O (the target member icons Io1 to Io3) in correspondence with each other (AR display Da). This display is the augmented reality (AR) display including an image of the real space. For example, the target recognition unit 23 recognizes the target member O, thereby enabling the display of the target member icon Io corresponding to the position of the target member O.

The image illustrating the structure generated by the display control unit 14 is sent to the terminal device 2 (S140) and the display unit 24 in the terminal device 2 shows the image illustrating the structure (S150).

(4) Viewing of Reference Information

The worker W can view the reference information by using the viewing unit 26. For example, the worker W can view the reference information by operating the target member icon Io included in either the virtual space display or the augmented reality (AR) display. For example, by tapping the target member icon Io, the reference information (for example, a drawing) of the target member O can be displayed.

(5) Instructions from the Office

The management device 1 can also display an image of the field corresponding to the position and orientation of the current terminal device 2. The manager M understands the progress of the work to perform addition and change of instructions by using the instruction input unit 17 as necessary. At this time, the manager M can refer to the additional information at the field.

For example, the manager M inputs the position on the three-dimensional data and the work instruction. The display control unit 14 displays this work instruction on the display unit 24 so as to correspond to the position on the three-dimensional data. The addition•change of this instruction can be displayed on the display unit 24 in the terminal device 2 as a virtual sticky note, for example. The worker W can perform addition and change of the work based on the addition•change of this instruction. As a result, flexible response according to the condition at the field is facilitated.

(6) Addition of Information at the Field

At the field, appropriate information can be added as necessary by using the information addition unit 27. A target is specified to add any information that the worker W notices. For example, by operating (for example, tapping) the target member icon Io included in either the virtual space display or the augmented reality (AR) display, the information addition icon Ii is displayed, and tapping the information addition icon Ii makes it possible to input the information regarding the target member.

The input additional information is transmitted to the management device 1 to be reflected in the database 11 in the management device 1. Further, the display control unit 14 can display this additional information on the display unit 24.

(7) Assistance of Imaging

As this additional information, the image photographed by the imaging unit 22 can be used. In this case, the imaging unit 22 photographs an image and records the image with the position and orientation of the terminal device 2 at a photographing time. At this time, the imaging assistance unit 28 assists in re-photographing corresponding to the recorded position and orientation. For example, the imaging assistance unit 28 displays an imaging range corresponding to the recorded position and orientation of the terminal device 2 on the display unit 24 (for example, the past frame F1). The worker W adjusts the distance between the terminal device 2 and the target to be photographed and the direction while checking the past frame F1, and thereby, the photographing at the same distance and in the same direction as in the past is enabled.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A field cooperation system, comprising:
 a terminal device that includes:
  a position measurement unit configured to measure a position of the terminal device; and
  a display unit configured to display a display image; and
 a management device that includes:
  a database storing three-dimensional data including layouts and dimensions of a structure; and
  a display control unit configured to generate the display image to illustrate the structure and an icon representing the position of the terminal device on the display unit in correspondence with each other based on the three-dimensional data stored in the database and the position of the terminal device measured by the position measurement unit,
 wherein
 the management device further includes a terminal position reception unit that receives position information of the terminal device, and
 the display control unit updates a position of the icon to be displayed on the display unit in response to a reception of the position information by the terminal position reception unit.

2. A field cooperation system, comprising:
 a terminal device that includes:
  a position measurement unit configured to measure a position of the terminal device; and
  a display unit configured to display a display image; and
 a management device that includes:
  a database storing three-dimensional data including layouts and dimensions of a structure; and
  a display control unit configured to generate the display image to illustrate the structure and an icon representing the position of the terminal device on the display unit in correspondence with each other based on the three-dimensional data stored in the database and the position of the terminal device measured by the position measurement unit,
 wherein
 the terminal device further includes a three-dimensional measurement sensor configured to measure a three-dimensional shape in a vicinity of the terminal device,
 the position measurement unit measures a position and orientation of the terminal device based on the three-dimensional shape measured by the three-dimensional measurement sensor, and
 the icon represents the position and orientation of the terminal device.

3. A field cooperation system, comprising:
 a terminal device that includes:
  a position measurement unit that measures a position of the terminal device; and
  a display unit that displays a display image; and
 a management device that includes:
  a database that stores three-dimensional data representing a layout of a structure; and
  a display control unit that generates the display image to illustrate the structure and an icon representing the position of the terminal device on the display unit in correspondence with each other based on the three-dimensional data and the measured position of the terminal device, wherein the database further has information on a member of the structure and a position of the member, the management device further includes a work plan creation unit that creates a work plan table representing a member and the order of work in correspondence with each other, and the display control unit generates the display image to illustrate a second icon that identifies the order of work on the display unit so as to correspond to the position of the member.

4. The field cooperation system according to claim 3, wherein the database further has reference information for a plurality of the members or a link to the reference information, the work plan table represents the member, the order of work, and the reference information in correspondence with one another, the display control unit generates the display image to illustrate a third icon corresponding to the reference information on the display unit, and the terminal device further includes a viewing unit that views the reference information by operating the displayed third icon.

5. The field cooperation system according to claim 3, wherein the management device further includes an instruction input unit that inputs a position on the three-dimensional data and a work instruction, and the display control unit generates the display image to illustrate the work instruction on the display unit so as to correspond to the position on the three-dimensional data.

6. The field cooperation system according to claim 3, wherein the terminal device further includes:

an imaging unit that photographs an image; and a target recognition unit that recognizes a member based on the photographed image, and the display unit displays the photographed image and a fourth icon corresponding to the member in correspondence with each other.

7. The field cooperation system according to claim 6, wherein the terminal device further includes an information addition unit that inputs additional information regarding the member, and the database stores the additional information.

8. The field cooperation system according to claim 7, wherein the display control unit generates the display image to illustrate the additional information on the display unit.

9. The field cooperation system according to claim 7, wherein the imaging unit photographs an image as the additional information and records the image with a position and orientation of the terminal device at a photographing time, and the terminal device further includes an imaging assistance unit that assists in re-photographing corresponding to the recorded position and orientation.

10. The field cooperation system according to claim 9, wherein the imaging assistance unit displays an imaging range corresponding to the recorded position and orientation of the terminal device on the display unit.

11. A management device, comprising:

a terminal position reception unit configured to receive position information of a terminal device;

a database storing three-dimensional data including layouts and dimensions of a structure; and a display control unit configured to display, based on the three-dimensional data stored in the database and the position information of the terminal device received by the terminal position reception unit, an image illustrating the structure and an icon representing a position of the terminal device on a display unit of the terminal device in correspondence with each other, wherein the display control unit updates a position of the icon to be displayed on the display unit in response to a reception of the position information by the terminal position reception unit.

* * * * *